United States Patent [19] [11] 4,298,988
Dages [45] Nov. 3, 1981

[54] DIGITAL CHANNEL SELECTION AND FINE TUNING SYSTEM

[75] Inventor: Charles L. Dages, Colmar, Pa.

[73] Assignee: Jerrold Electronics Corp., Hatboro, Pa.

[21] Appl. No.: 65,515

[22] Filed: Aug. 10, 1979

Related U.S. Application Data

[63] Continuation-in-part of Ser. No. 10,408, Feb. 8, 1979.

[51] Int. Cl.³ .............................................. H04B 1/26
[52] U.S. Cl. .................................. 455/182; 455/184; 455/186; 455/316
[58] Field of Search ............... 455/179, 182, 184–186, 455/196, 197, 315, 316

[56] References Cited
U.S. PATENT DOCUMENTS 3,961,266  6/1976  Tanaka ................................. 455/184
4,004,232  1/1977  Amaya ................................ 455/184
4,061,980  12/1977  Sato ..................................... 455/316
4,114,100  9/1978  Klank ................................... 455/184
4,144,498  3/1979  Tanaka ................................. 455/185

Primary Examiner—Jin F. Ng
Attorney, Agent, or Firm—Stephen B. Judlowe

[57] ABSTRACT

A tuning system for use in a radio frequency multi-signal receiving system, e.g., for CATV converters, utilizes a closed feedback loop digital arrangement for channel selection (local oscillator frequency control) and channel fine tuning. The system may be implemented either via discrete hardware or through the use of microprocessor controlled apparatus.

In accordance with one aspect of the present invention, double heterodyne tuning apparatus automatically compensates for frequency drift in the second local oscillator.

7 Claims, 2 Drawing Figures

DIGITAL CHANNEL SELECTION AND FINE TUNING SYSTEM

This is a continuation-in-part of my earlier application, Ser. No. 10,408, filed Feb. 8, 1979.

DISCLOSURE OF THE INVENTION

1. Field of the Invention and Related Applications

This invention relates to tuning systems for radio frequency (R.F.) multi-channel receiving systems and, more particularly, to a double heterodyne tuning system employing digital processing and a storage look-up table for effecting channel selection and fine tuning.

2. Description of the Prior Art

Tuning systems for R.F. receiving systems are well known and widely used. Such systems essentially comprise a variable frequency local oscillator used in a heterodyne application to frequency shift a desired incoming R.F. signal (e.g., a television program channel spectrum) to that of a fixed intermediate frequency band. Such tuning systems are of two basic types; open loop and closed loop.

Open loop systems employ a variable frequency local oscillator, the frequency of which is manually or otherwise set—but which is not monitored to continuously assure that the oscillator is actually operating at the desired frequency. Changes in component values, as a result of component aging and/or ambient temperature changes, can cause the actual frequency of the oscillator to deviate from the desired frequency. In an open loop system this frequency deviation, if not undetected, results in degraded reception.

Closed loop systems, to avoid the disadvantages of open loop systems, incorporate monitoring techniques for frequency error detection and correction. That is, closed loop systems sense the actual output frequency of the variable frequency oscillator; compare the actual frequency with the desired frequency indicated by the channel selection apparatus; detect any frequency error; and apply necessary correction factors to shift the actual oscillator frequency to the desired value. Closed loop systems therefore are superior to comparable grade open loop systems in that frequency deviation in a closed loop system, is detected and corrected.

It is therefore an object of this invention to provide an improved tuning system for R.F. receiver apparatus which effects and maintains automated channel reception and channel fine tuning.

It is another object of the present invention to provide improved double heterodyning tuning apparatus which automatically corrects for any frequency drifting of the second stage, fixed frequency local oscillator.

SUMMARY OF THE INVENTION

In accordance with the invention, a closed loop tuning system is implemented utilizing digital techniques and components.

It is a feature of the invention that a first digital word is generated which represents the frequency of a variable frequency first local oscillator over a predetermined sampling period.

It is a further feature of the invention that a second digital word is retrieved from digital storage in response to incoming channel selection information, the second digital word representing the quiescent desired frequency of the variable frequency oscillator.

It is an additional feature of the present invention that the second digital word is modified to track any frequency drift of the second (nominally fixed) local oscillator for a double heterodyne tuning system, thereby forming a third digital word.

It is another feature of the invention that the first and third digital words are compared and the difference in value between the digital words used to shift the actual first oscillator frequency to the desired oscillator frequency.

The foregoing and other objects and features of this invention will be more fully understood from the following description of an illustrative embodiment thereof taken in conjunction with the accompanying drawings.

DETAILED DESCRIPTION

Figure 1:
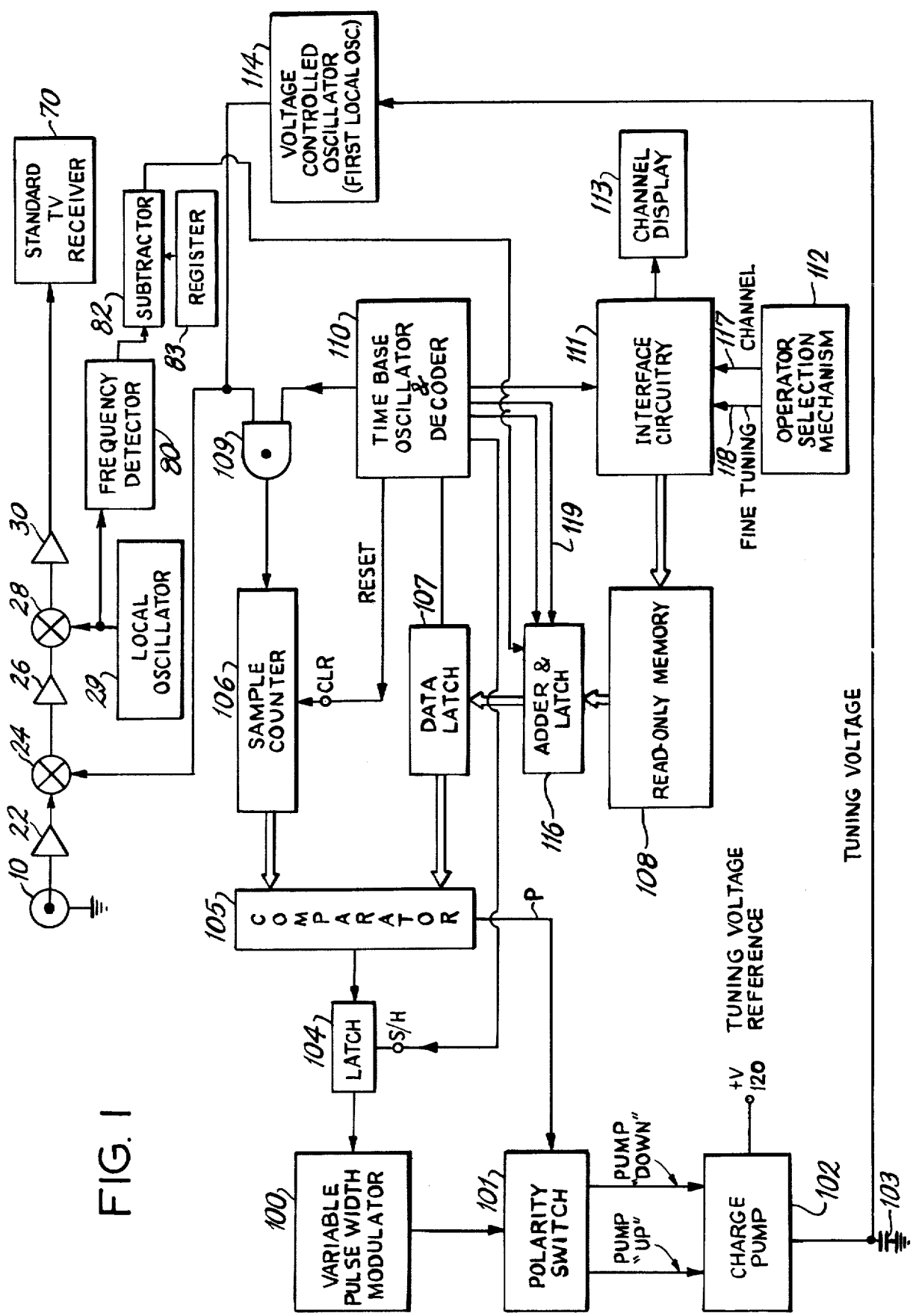
FIG. 1 illustrates one embodiment of the instant invention in block diagram form.

Referring now to FIG. 1, there is illustrated a block diagram of one digital tuning system embodiment of the invention. The tuning apparatus is shown as being part of a composite frequency converter—e.g., as employed in CATV/MATV systems to select one of a plurality of video signals distributed via a coaxial cable 10 for viewing by a standard television receiver 70. As is customary practice in converter usage, the television receiver 70 is constantly tuned to a locally unused channel, and the converter tunes the desired program on the cable 10 by shifting its frequency spectrum to that of the predetermined locally vacant channel. The converter is of the per se conventional double heterodyne type including an input radio frequency amplifier 22, first mixer 24 and intermediate frequency filter and amplifier 26 to convert a selected signal on the cable 10 to the fixed pass band of amplifier/filter 26. As more fully discussed below, a voltage controlled oscillator 114 serves as the local oscillator for the first mixer stage 24.

The double heterodyne converter also includes a second frequency converting stage formed of a mixer 28, filter/amplifier 30 passing the locally vacant channel spectrum, and a fixed frequency second local oscillator 29. The circuitry of FIG. 1 is designed to sense the actual operating frequency of local oscillator 114, and to maintain (or change) the actual frequency of operation to a desired frequency of operation represented by a particular operative one of plural digital words stored in memory 108 (herein: the "nominal frequency")—as corrected for any frequency drift for the second local oscillator 29. The nominal frequency is retrieved from memory 108 in response to incoming channel information entered via operator selection mechanism 112, and corrected for second oscillator drift in an adder and latch 116. The desired frequency, represented by the drift-corrected retrieved digital word, is stored in latch 107 and compared with the actual frequency determined by sample counter 106 in conjunction with gating and timing circuitry. The difference between the actual and desired frequencies is used to add or delete charge from capacitor 103 which, in turn, changes the frequency of the first local oscillator 114. Circuit operation is described in greater detail hereinafter.

More particularly, oscillator 114 is a voltage controlled oscillator, the output of which is utilized as the local oscillator in a per se conventional heterodyne application as above discussed to beat a desired component signal of an incoming R.F. signal spectrum to a substantially fixed intermediate frequency for use in the receiving system. The output frequency of oscillator 114 is dependent on the voltage present across capacitor 103, i.e., the frequency of oscillator 114 will vary in direct relation to the addition or deletion of charge in capacitor 103. The operation of such a voltage controlled oscillator and the associated mixer circuit 24 is well known in the art and will not be further detailed herein.

Operator selection mechanism 112 inputs channel selection information and fine tuning information into the tuning system. Mechanism 112 can take the form of a keyboard, a thumb wheel encoded switch, a rotary dial with associated circuitry or any other suitable electronic/electromechanical device or circuit per se well known and simply serves to represent each receiver channel, and any associated fine tuning information, by unique electrical signals. These channel/fine tuning electrical signals are converted into unique digital addresses, for example, by an analog-to-digital converter with each address representing a particular storage location in Read Only Memory (ROM) 108. The digital addresses are supplied to interface circuitry 111 and from there to ROM 108 in a manner detailed hereinafter. ROM 108 stores a plurality of digital words, each of which represent the desired operating frequency of oscillator 114 for a particular receiver operating channel. Channel display 113 displays each channel selected for reference by the receiver operator.

Time base oscillator and decoder 110 provides timing and control signals for the entire digital tuning system. Appropriate timing and control signals are applied to interface circuitry 111, latches 104 and 107, and gate 109. The utilization of the timing signals in conjunction with the operation of the circuit will be detailed hereinafter. Timing circuitry such as that included within oscillator and decoder 110 is well known in the art. One specific implementation simply comprises a cascaded oscillator and counter, the counter, in turn, driving plural coincidence gates or integrated circuit decoders for decoding corresponding time intervals within an overall cyclically recurring oscillator time pulse counting cycle.

The timing signals from oscillator and decoder 110 selectively enable gate 109 for a fixed period of time thereby applying the output of oscillator 114 to an initially cleared counter 106. Counter 106 counts the oscillator output pulses and compiles a first digital word representative of the actual oscillator frequency (as measured by the number of oscillations occurring within the fixed gating period). Comparator 105 compares this first digital word with a second digital word, retrieved from memory 108 and stored in latch 107 in manner to be detailed hereinafter, and the difference in binary value between the first and second digital words as determined by comparator 105 is stored in latch 104. Comparator 105 also produces a polarity level signal P which indicates whether the difference stored in latch 104 is a positive or negative value.

Variable pulse width modulator 100 accepts the binary difference word stored in latch 104 and produces an output pulse whose width is dependent on the magnitude of the binary number, i.e., a narrow output pulse is produced in response to a small binary number while a wide output pulse is produced in response to a large binary number. The output pulse from modulator 100 is applied to a polarity switch 101. Various circuitry can be employed to implement the functions required of modulator 100. One suggested implementation is to simply apply the binary number from latch 104 to one input of a comparator circuit and apply the output of an initially cleared clocked binary counter to the remaining comparator input. The output of the comparator circuit is initially established at a binary one level, e.g., a logical "1" level and assumes a logical "0" level when the count of the binary counter equals the binary number stored in latch 104. The output of the comparator thus produces a wide pulse in response to a large number stored in latch 104 (corresponding to a relatively large number of counts) and a narrow pulse in response to a small number stored in latch 104.

Polarity switch 101 receives the variable width pulses from modulator 100 and the error polarity signal from comparator 105. Detector 101, in response to polarity signal P, steers (gates) the variable width pulses from modulator 100 to generate either a "pump-up" signal or a "pump-down" signal for application to charge pump 102. Switch 101 may comprise simple steering (coincidence) gates which will direct the variable width pulse from modulator 100 to the "pump-up" output in response to a positive polarity signal and direct the variable width pulse to the "pump-down" output in response to a negative polarity signal. Other per se well known appropriate circuit arrangements could of course also be used to implement switch 101.

Charge pump 102 adds or deletes charge from capacitor 103 in response to the "pump-up" and "pump-down" signals applied thereto from detector 101. Adding or deleting charge to capacitor 103 varies the voltage across the capacitor and thus alters the frequency of oscillator 114 in the manner described above. Charge pump 102 may comprise a circuit arrangement wherein, in response to a "pump-up" signal, charging current from tuning voltage reference terminal 120 is applied to capacitor 103 for an interval of time equal to the width of the "pump-up" signal pulse. The width of the "pump-up" signal pulse (and thereby also the charge increment to capacitor 103) is of course equal to the width of the output pulse from modulator 100. Alternatively, charge pump 102 responds to a "pump-down" signal by draining charge from capacitor 103 for an interval of time equal to the width of the "pump-down" signal pulse. The width of the "pump-down" signal pulse is also equal to the width of the pulse from modulator 100. Specific circuits necessary to accomplish the aforesaid functions of charge pump 102 are well known in the art. Thus, for example, the "pump-up" signal may enable a transistor switch and limiting resistor connecting terminal 120 and capacitor 103, while the "pump-down" signal enables a transistor switch connecting capacitor 103 and circuit ground via a discharge current limiting resistor.

The operation of the embodiment in FIG. 1 will now be described in detail. Assume that the circuitry in FIG. 1 has been reset to an initial state by oscillator and decoder 110 in preparation for operation. Information representative of a desired operating channel is applied to mechanism 112 and in response thereto a digital address word, generated in the manner described above, is applied to circuitry 111 via path 117. Circuitry 111, in response to a command signal from oscillator and decoder 110, applies the digital address to an address input of ROM 108 and the digital word representing the desired operating frequency for the selected channel is retrieved from ROM 108, stored in adder and latch 116 (employed for fine tuning and second local oscillator frequency drift purposes below discussed), and applied to data latch 107. The digital word is stored in latch 107 in response to a command signal from oscillator and decoder 110.

For a predetermined, fixed and repetitive period of time gate 109 is enabled by a command signal from oscillator and decoder 110. In response thereto, the output signal from local oscillator 114 is passed through gate 109 and applied to an initially reset counter 106. Counter 106 commences to count the oscillator output pulses and continues to do so as long as gate 109 remains enabled. Oscillator and decoder 110 maintains gate 109 in an enabled state for a predetermined interval of time. Subsequent to the termination of the predetermined interval gate 109 is disabled and, accordingly, at this time, counter 106 has stored therein a digital word representing the actual frequency of oscillator 114.

The digital word stored in counter 106, representing the actual oscillator frequency, is compared in comparator 105 with the digital word stored in latch 107, representing the desired oscillator frequency. The result of the comparison by comparator 105, is the generation of a binary number frequency error signal, and the generation of a polarity level signal indicating whether the digital word stored in counter 106 is greater than the digital word stored in latch 107 or vice versa. The binary number, representing the binary difference between the actual and desired frequencies is stored in latch 104 and the polarity signal is applied to error polarity responsive switch 101.

The binary number stored in latch 104 is applied to modulator 100. As described above, this binary number is utilized by modulator 100 to generate a variable width pulse, the pulse width being directly dependent on the magnitude of the latched binary number (frequency error amplitude). The variable width output pulse from modulator 100 is applied to switch 101 along with the polarity signal from comparator 105. Switch 101, in response to the polarity signal, applies the variable width output pulse to either the "pump-up" or "pump-down" output and from there to charge pump 102. Charge pump 102 then either adds charge or removes charge from capacitor 103, as described above, thereby changing the frequency of oscillator 114 from the previously obtained actual frequency to the desired frequency until, at steady state, the two are substantially equal.

The process just described will continue in response to command signals from oscillator and decoder 110 to continuously monitor the output frequency of oscillator 114 and change, if necessary, the actual frequency of oscillation to the desired frequency of oscillation. It is of course understood that each time a new receiver channel is selected by operator selection mechanism 112 the circuit operation just described will serve to change the frequency of oscillator 114 to the new operating channel frequency.

An additional capability of the instant invention relates to the use of fine-tuning. More particularly, the circuit of FIG. 1 is designed to operate in a number of different R.F. receiver environments and in each such environment, minor circuit value variations in the remainder of the R.F. receiver configuration may require a frequency of oscillation for the heterodyning local oscillator 114 slightly different than the nominal value stored in ROM 108. Therefore, in order to achieve these slight frequency changes, the instant invention provides for the input of fine-tuning information.

The fine tuning information is entered via selection mechanism 112. In response thereto mechanism 112 generates a digital address for ROM 108 in the manner described above, the location being addressed having stored therein a digital word representative of a relatively small increment in the desired operating frequency. This fine tune digital word is stored in the latch portion of the adder and latch 116 in response to a command from circuitry 110, and added to the principal frequency determining word also stored in the latch/adder 116. The sum of the two latched words, i.e., the principal frequency channel selection value and the fine tuning increment, is then applied to and stored in latch 107 and the sum is compared with the actual frequency in the manner described above. In this manner the frequency of local oscillator 114 can be slightly varied in response to the input of fine tuning information, with the amount of the frequency change being dependent on the value of the third digital word stored in ROM 108.

In accordance with one aspect of the present invention, the FIG. 1 apparatus also includes structure for automatically compensating the double heterodyne converter operation for any frequency deviation or drift for the second stage local oscillator 29. It will be appreciated that the normal function of the local oscillator 29 is to exhibit a constant output frequency irrespective of the particular incoming frequency selected for reception, i.e., to convert the intermediate frequency output of filter/amplifier 26 to the frequency expected by the standard television receiver 70 (viz, that of a locally unused television channel). Should the local oscillator 29 inadvertently drift in frequency, however, that frequency variation unless compensated for offsets the converter output frequency vis-a-vis the locally unused channel to which the receiver 70 is tuned. It is one function of the present invention to automatically overcome that drift.

In brief, this is effected by detecting the frequency variation of the second local oscillator 29 and using that measured deviation, if any, to correspondingly offset the frequency of the first stage local oscillator 114. This places the desired signal at the output of the band pass of intermediate frequency amplifier 26 in a frequency spectrum such that, when beat against the desired output of the second stage local oscillator 29, the resulting signal is precisely where it should be (again, the frequency band of the locally unused channel).

To effect the above, the frequency of the local oscillator 29 is measured by a frequency detector 80 of any well known type (e.g., one paralleling elements 106, 109 and 110 of FIG. 1). The actual frequency value has subtracted therefrom the correct fixed frequency for the oscillator 29 as stored, for example, in a latch or register 83. The output of the subtractor circuit 82 is then supplied to a latch in the adder and latch circuit 116 where it is algebraically combined (summed) with the output of the read only memory 108 (both the channel and fine tuning information). In this manner the frequency of the local oscillator 114 is varied slightly in response to and in a direction and amount to offset the frequency drift of the second stage local oscillator 29, hence preserving the ultimate converter output in the predetermined frequency spectrum. The particular polarity for algebraically combining the subtractor 82 output with the information read out from the ROM 108 depends on the frequency value for the first local oscillator 114 vis-a-vis the incoming signal band. The second oscillator drift is added to or subtracted from the net ROM contents depending upon whether the first stage VCO 114 local oscillator frequency is above (the typical case) or below the incoming signal band.

Figure 2:
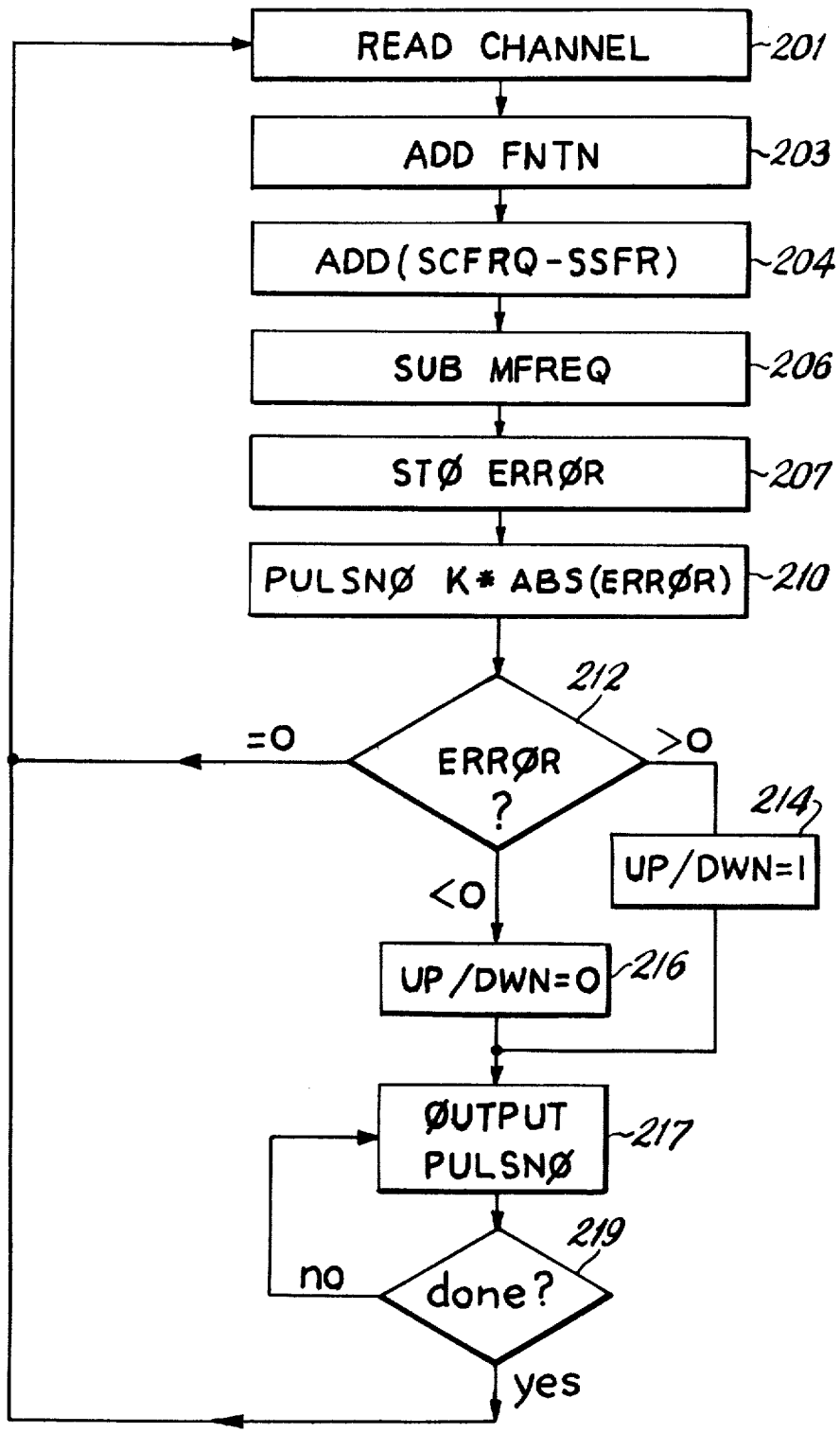
FIG. 2 illustrates a flow chart for a microprocessor implementation of the instant invention.

The circuitry of FIG. 1 can be implemented with standard circuit elements as above discussed. However, it is also possible to implement the functions performed by the circuitry of FIG. 1 with a microprocessor configuration. Shown in FIG. 2 is a flow chart for program control of such a microprocessor configuration wherein the microprocessor performs all the functions of the circuitry of FIG. 1, except for those operations performed by local oscillator 114, input mechanism 112, display 113, charge pump 102, frequency detector 80 and capacitor 103. The flow chart of FIG. 2 comprises general programming capable of being used with a number of commercially available microprocessors. Actual adaptation of the flow chart to a particular microprocessor configuration would be readily accomplished by one skilled in the art of microprocessor utilization.

Similarly, while program assembly language level instructions are illustratively and schematically shown in FIG. 2, it will be appreciated by those skilled in the art that program coding in any specific program language may be employed.

For the illustrative computer processing mode of operation shown in FIG. 2, computation variable storage locations will be assumed as follows:

MFREQ is a storage location corresponding to and for storing the measured oscillator 114 frequency comparable to the contents of counter 106 in FIG. 1;

CHANEL is a location holding the nominal frequency word supplied by read only memory 108 corresponding to the channel signal (the desired channel) selected by the user for viewing at operator selection mechanism 112;

FNTN is the work supplied from read only memory 108 corresponding to the fine tuning information entered by user at the operator selection mechanism 112;

UP/DN is a cell effectively signalling whether or not a pump "up" or pump "down" mode is in effect;

ERR$\phi$R is a storage location containing the amplitude and polarity of the difference between the desired and actual frequencies (comparable to the output of comparator 105 in FIG. 1);

SCFRQ stores the contents of the frequency of the second oscillator 29 (as by reading into a computer storage cell the output of frequency detector 80 of FIG. 1); and SSFR is a fixed number in a storage cell for the proper frequency value of the second stage local oscillator 29 (the contents of register 83 of FIG. 2).

The first two operations 201 and 203 of FIG. 2 simply read in and linearly combine the desired channel and fine tuning information, which is corrected for any possible oscillator drift in instruction 204. With respect to instruction 204, it is observed that the difference SCFRQ minus SSFR is a measure of the difference between the actual and the desired frequencies for the second stage local oscillator 29.

The comparison instruction 206 subtracts the measured frequency (MFREQ) from the desired frequency resulting after execution of instruction 204, and the result (the instantaneously obtaining frequency error) stored at the location ERR$\phi$R. The number of pulses (PULSN$\phi$—pulse number replacing FIG. 1 pulse width) to charge or discharge the frequency determining capacitor 103 is then computed by multiplying a constant (stored in a variable location K) with the absolute value of the frequency error signal stored in ERR$\phi$R.

Branching or test instruction 212 examines the contents of the variable location ERR$\phi$R and returns control to instruction 201 to again examine the input controls if the difference between the desired and measured frequencies (i.e., the contents of ERR$\phi$R) equals zero. Assuming the contents of ERR$\phi$R are greater than zero (actual frequency too low) or less than zero (actual frequency too high) an appropriate flag bit is loaded into the pump UP/DN controller, and then the appropriate number of pulses (stored in PULSN$\phi$) are applied to either charge or discharge the capacitor 103 by a minor loop consisting of instructions 217 and 219. When this is completed, system operation returns for a new iteration to continue operational control. In the above described manner, then, the tuning apparatus of the instant invention operates to continuously and automatically maintain signal reception for the desired channel, maintaining automatic correction for any drift of the second local oscillator.

Although specific embodiments of this invention have been shown and described, it will be understood that various modifications may be made without departing from the spirit of this invention.

What is claimed is:

1. A closed loop double heterodyne digital tuning system, the system comprising, first local oscillator means responsive to a variable control voltage for generating an oscillation having a frequency dependent on the magnitude of said control voltage, sampling means for sampling the actual output frequency of said oscillator means for a predetermined interval of time and for generating a first digital word representing the actual value of said frequency, means responsive to incoming channel information for generating a selected one of plurality of address words, each address word representing a particular video operating channel, storage means for storing a plurality of second digital words, each of the second digital words representing a desired nominal value of frequency for said oscillator means, means responsive to the address words for retrieving from said storage means one of said second digital words, the particular location of said second digital word within said storage means being identified by said address word, a second local oscillator, second local oscillator drift correcting means including means for sensing the output frequency of said second local oscillator, and means connected to said sensing means for generating a third digital word representative of the frequency variation of said second local oscillator, means for combining said third digital word with the second digital word retrieved from said storage means and for storing the results of such combination, comparator means for comparing the values of said first digital word with the value of said stored combined second and third digital words, and means responsive to a difference in value between said first digital word, and said stored second and third digital words determined by said comparator means for varying said control voltage for said oscillator means, whereby said actual frequency value is changed to the correct frequency value.

2. A closed loop digital tuning system in accordance with claim 1, wherein there is further included means responsive to fine tuning information for retrieving a fourth digital word from said storage means, said combining means combining said fourth digital word with said second and third digital words, and said comparing means comparing the value of said first digital word, with the combined value of said second, third and fourth digital words.

3. A closed loop digital tuning system in accordance with claim 1, wherein said sampling means includes a binary counter for counting cycles of said output oscillation of said first oscillator means, and means for applying said oscillation to said binary counter for said predetermined interval of time.

4. A closed loop digital tuning system in accordance with claim 3, wherein said control voltage varying means includes means responsive to the difference in value between said first, and said second and third digital words for generating a variable width pulse, the width of said pulse being directly related to the difference in binary value between said first, and said second and third digital words.

5. A closed loop digital tuning system in accordance with claim 4, wherein there is further included means for determining the polarity of the difference in value between said first, and said second and third digital words, and means responsive to a positive polarity and to said variable width pulse for increasing the value of said control voltage and responsive to a negative polarity and to said variable width pulse for decreasing the value of said control voltage.

6. A closed loop digital tuning system in accordance with claim 5, wherein there is further included means responsive to fine tuning information for retrieving a fourth digital word from said storage means, means for adding said fourth digital word to said second and third digital words, and said comparing means comparing the value of said first digital word with the value of the sum of said second, third and fourth digital words.

7. A closed loop double heterodyne digital tuning system, the system comprising, first local oscillator means responsive to a variable control signal for generating an oscillation having a frequency dependent on the magnitude of said control signal, sampling means for sampling the actual output frequency of said oscillator means for a predetermined interval of time and for generating a first signal representing the actual value of said frequency, means responsive to incoming channel information for generating a selected one of plurality of address signals, each address signal representing a particular video operating channel, storage means for storing a plurality of second signals, each of the second signals representing a desired nominal value of frequency for said oscillator means, means responsive to the address signal for retrieving from said storage means one of said second signals, the particular location of said second signal within said storage means being identified by said address signal, a second local oscillator, second local oscillator drift correcting means including means for sensing the output frequency of said second local oscillator, and means connected to said sensing means for generating a third signal representative of the frequency variation of said second local oscillator, means for combining said third signal with the second signal retrieved from said storage means and for storing the results of such combination, comparator means for comparing the values of said first signal with the value of said stored combined second and third signals, and means responsive to a difference in value between said first signal, and said stored second and third signals determined by said comparator means for varying said control signal for said oscillator means, whereby said actual frequency value is changed to the correct frequency value.

* * * * *